(12) United States Patent
Noda et al.

(10) Patent No.: US 12,366,974 B2
(45) Date of Patent: Jul. 22, 2025

(54) MEMORY SYSTEM PERFORMING MULTI-STEP WRITE OPERATION AND CONTROL METHOD THEREOF

(71) Applicant: Kioxia Corporation, Tokyo (JP)

(72) Inventors: Yuko Noda, Kawasaki Kanagawa (JP); Kiwamu Watanabe, Kawasaki Kanagawa (JP); Masahiro Saito, Tokyo (JP); Yoshiki Takai, Fujisawa Kanagawa (JP)

(73) Assignee: Kioxia Corporation, Tokyo (JP)

( * ) Notice: Subject to any disclaimer, the term of this patent is extended or adjusted under 35 U.S.C. 154(b) by 42 days.

(21) Appl. No.: 18/448,481

(22) Filed: Aug. 11, 2023

(65) Prior Publication Data

US 2024/0053903 A1    Feb. 15, 2024

(30) Foreign Application Priority Data

Aug. 12, 2022    (JP) .................................. 2022-128848

(51) Int. Cl.
*G06F 3/06* (2006.01)

(52) U.S. Cl.
CPC .......... *G06F 3/0619* (2013.01); *G06F 3/0659* (2013.01); *G06F 3/0679* (2013.01)

(58) Field of Classification Search
CPC ..... G06F 3/0619; G06F 3/0679; G06F 3/0659
See application file for complete search history.

(56) References Cited

U.S. PATENT DOCUMENTS

| 8,407,405 | B2 | 3/2013 | Otsuka | |
|---|---|---|---|---|
| 10,614,886 | B2 * | 4/2020 | Joe | G11C 16/08 |
| 2019/0361614 | A1 * | 11/2019 | Natarajan | G06F 3/0679 |
| 2021/0064285 | A1 * | 3/2021 | Ji | G06F 3/0679 |
| 2021/0264968 | A1 | 8/2021 | Kim | |
| 2021/0375376 | A1 * | 12/2021 | Gupta | G06F 3/0604 |
| 2023/0420051 | A1 * | 12/2023 | Cai | G11C 11/5671 |

FOREIGN PATENT DOCUMENTS

JP    5480714 B2    4/2014

* cited by examiner

*Primary Examiner* — Mark A Giardino, Jr.
(74) *Attorney, Agent, or Firm* — Kim & Stewart LLP

(57) ABSTRACT

A memory system includes a non-volatile memory including a plurality of memory cells; and a controller. The controller is configured to perform a multi-step write operation to write multi-bit data with respect to each of target memory cells through a first programming to set a first threshold voltage and then a second programming to set a second threshold voltage. The controller, during the multi-step write operation, determines a time period elapsed from a first time at which the first programming with respect to a first memory cell of the target memory cells has been performed, and varies a second time at which the second programming with respect to the first memory cell is performed based on whether the time period is greater than a first threshold.

18 Claims, 14 Drawing Sheets

| ORDER | 1st/2nd STEP | WL | STRING |
|---|---|---|---|
| 0 | 1st STEP | WL0 | 0 |
| 1 | 1st STEP | WL0 | 1 |
| 2 | 1st STEP | WL0 | 2 |
| 3 | 1st STEP | WL0 | 3 |
| 4 | 1st STEP | WL0 | 4 |
| 5 | 2nd STEP | WL0 | 0 |
| 6 | 1st STEP | WL1 | 0 |
| 7 | 2nd STEP | WL0 | 1 |
| 8 | 1st STEP | WL1 | 1 |
| 9 | 2nd STEP | WL0 | 2 |
| 10 | 1st STEP | WL1 | 2 |
| 11 | 2nd STEP | WL0 | 3 |
| 12 | 1st STEP | WL1 | 3 |
| 13 | 2nd STEP | WL0 | 4 |
| 14 | 1st STEP | WL1 | 4 |
| 15 | 2nd STEP | WL1 | 0 |
| 16 | 1st STEP | WL2 | 0 |
| 17 | 2nd STEP | WL1 | 1 |
| 18 | 1st STEP | WL2 | 1 |
| 19 | 2nd STEP | WL1 | 2 |

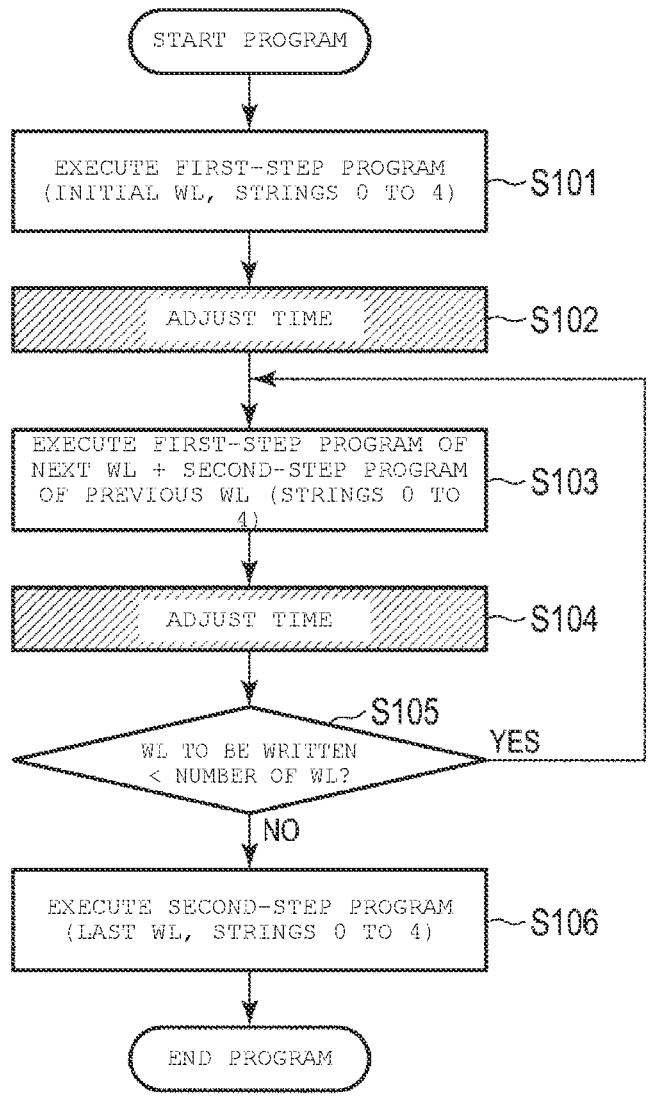

MEMORY SYSTEM PERFORMING MULTI-STEP WRITE OPERATION AND CONTROL METHOD THEREOF

CROSS-REFERENCE TO RELATED APPLICATION

This application is based upon and claims the benefit of priority from Japanese Patent Application No. 2022-128848, filed Aug. 12, 2022, the entire contents of which are incorporated herein by reference.

FIELD

Embodiments described herein relate generally to a memory system and a control method.

BACKGROUND

For example, in a NAND flash memory included in a memory system such as a solid state drive (SSD), microfabrication of a memory cell is being progressed. In addition, a technology for writing multi-valued data composed of a plurality of bits to one memory cell is being evolved to a multi-level cell (MLC) [2 bits], a triple-level cell (TLC) [3 bits], and a quad-level cell (QLC) [4 bits]. The writing of 1 bit of data to one memory cell is referred to as a single-level cell (SLC) writing.

On the other hand, QLC is faster in reliability deterioration due to data retention deterioration (e.g., increase in bit error rate (BER) over time) compared to SLC or TLC. For that reason, there is a large burden of background processing as reliability countermeasures that are required to be executed internally in the memory system.

BRIEF DESCRIPTION OF THE DRAWINGS

FIG. 5 is a flowchart showing a procedure of writing (programming) to a NAND memory implemented by the memory system according to the first embodiment.

DETAILED DESCRIPTION

Embodiments provide a memory system that can prevent reliability deterioration due to data retention deterioration, and a method of controlling a memory system.

In general, according to an embodiment, a memory system includes a non-volatile memory including a plurality of memory cells; and a controller. The controller is configured to perform a multi-step write operation to write multi-bit data with respect to each of target memory cells through a first programming to set a first threshold voltage and then a second programming to set a second threshold voltage. The controller, during the multi-step write operation, determines a time period elapsed from a first time at which the first programming with respect to a first memory cell of the target memory cells has been performed, and varies a second time at which the second programming with respect to the first memory cell is performed based on whether the time period is greater than a first threshold.

Hereinafter, embodiments will be described with reference to the drawings.

First Embodiment

First, a first embodiment will be described.

Figure 1:
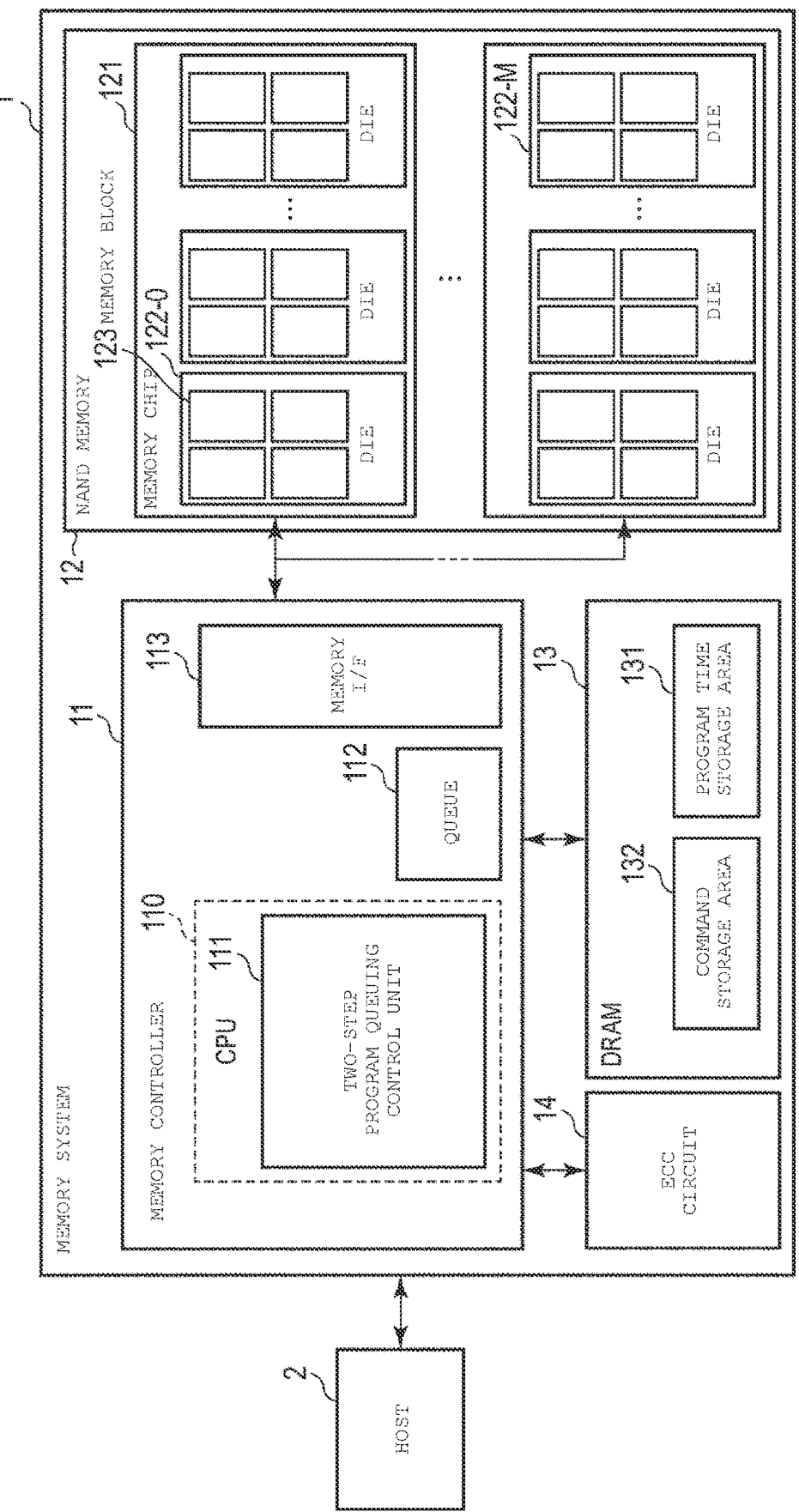
FIG. 1 is a diagram showing a configuration example of a memory system according to a first embodiment.

FIG. 1 is a diagram showing a configuration example of a memory system 1 according to the first embodiment. The memory system 1 is connected to a host 2 via an interface in accordance with PCI Express® (PCIe®) standards, for example. The host 2 is an information processing device such as a server or a personal computer (PC).

The memory system 1 has a memory controller 11, a NAND flash memory (NAND memory) 12, a dynamic random access memory [RAM] (DRAM) 13, and an error correcting code (ECC) circuit 14.

The memory controller 11 communicates with the host 2 via a protocol in accordance with NVM Express® (NVMe®) standards, for example. The memory controller 11 writes data to the NAND memory 12 according to a write command from the host 2. In addition, the memory controller 11 reads the data from the NAND memory 12 according to a read command from the host 2. The memory controller 11 may autonomously read or write data from or to the NAND memory 12 regardless of commands from the host 2 for the purpose of maintaining the data stored in the NAND memory 12, optimizing the NAND memory 12, and the like.

The NAND memory 12 has a plurality of memory chips 121. Each of the plurality of memory chips 121 has a plurality of dies 122. In this case, the number of dies 122 in the NAND memory 12 is defined as M. M is a natural number of 2 or more. Hereinafter, reference numerals 122-0, . . . , 122-M are used when referring to a specific die, or reference numeral 122 is used when any die is referred to or when a certain die is not distinguished from the other dies.

Each of the plurality of dies 122 has a plurality of memory blocks 123. Each of the plurality of memory blocks 123 has a plurality of pages (not shown). Writing of data to the NAND memory 12 and reading of data from the NAND memory 12 are performed in units of pages. Since data cannot be overwritten to a page that has written data, the written data is updated by invalidating the original data in a certain page and writing the new data to the other page. Data is erased in units of the memory block 123.

A plurality of channels are provided between the memory controller 11 and the NAND memory 12, for example, in one-to-one correspondence with the plurality of memory chips 121. Each of the plurality of channels includes, for example, as many signal lines as there are dies 122 in each memory chip 121 in order for the memory controller 11 to communicate with the dies 122.

The plurality of memory chips 121 can operate in parallel in the NAND memory 12. Therefore, the memory controller 11 can concurrently (in parallel) write data to the NAND memory 12 and read data from the NAND memory 12 for pages corresponding to the number of channels.

The DRAM 13 is a volatile storage medium used by the memory controller 11 as a work area. A program time storage area 131 and a command storage area 132 are provided in the DRAM 13. The usage of each area will be described below. A static RAM (SRAM) (not shown) or the like in the memory controller 11 may be used as a work area of the memory controller 11. That is, the memory system 1 may be configured without the DRAM 13.

The ECC circuit 14 generates an error correction code for detecting and correcting any future error in data to be written to the NAND memory 12. In addition, the ECC circuit 14 uses an error correction code to check for errors in data read from the NAND memory 12, and if any errors are detected, the ECC circuit 14 corrects the errors.

The memory controller 11 is implemented as a system on chip (SoC), for example. The memory controller 11 has a two-step program queuing control unit 111, a queue 112, and a memory interface 113. The two-step program queuing control unit 111 is implemented by a CPU 110 executing firmware, for example. The two-step program queuing control unit 111 may be implemented as hardware such as an electric circuit, for example.

The memory controller 11 writes data to the NAND memory 12 by applying QLC writing of writing 4 bits to one memory cell. In addition, the memory controller 11 writes 4 bits to each memory cell in two steps. The two-step program queuing control unit 111 controls a timing of the second-step writing, thereby preventing reliability deterioration due to data retention deterioration that is more likely to occur in QLC. The details of the two-step program queuing control unit 111 will be described below. Hereinafter, the first-step writing (programming) may be referred to as a first-step program (or programming_, and the second-step writing may be referred to as a second-step program (or programming).

The queue 112 stores commands for the NAND memory 12. The two-step program queuing control unit 111 controls an input timing of a command for requesting the NAND memory 12 for the second-step program to the queue 112. The program time storage area 131 is an area for storing time information necessary for controlling the input timing of the command to the queue 112, and the command storage area 132 is an area for storing a command to suspend the input to the queue 112.

The memory interface 113 transmits the command stored in the queue 112 to the NAND memory 12 and receives a processing result of the command from the NAND memory 12. Specifically, the memory interface 113 performs communication with each die 122 via the above-described channels.

Figure 2:
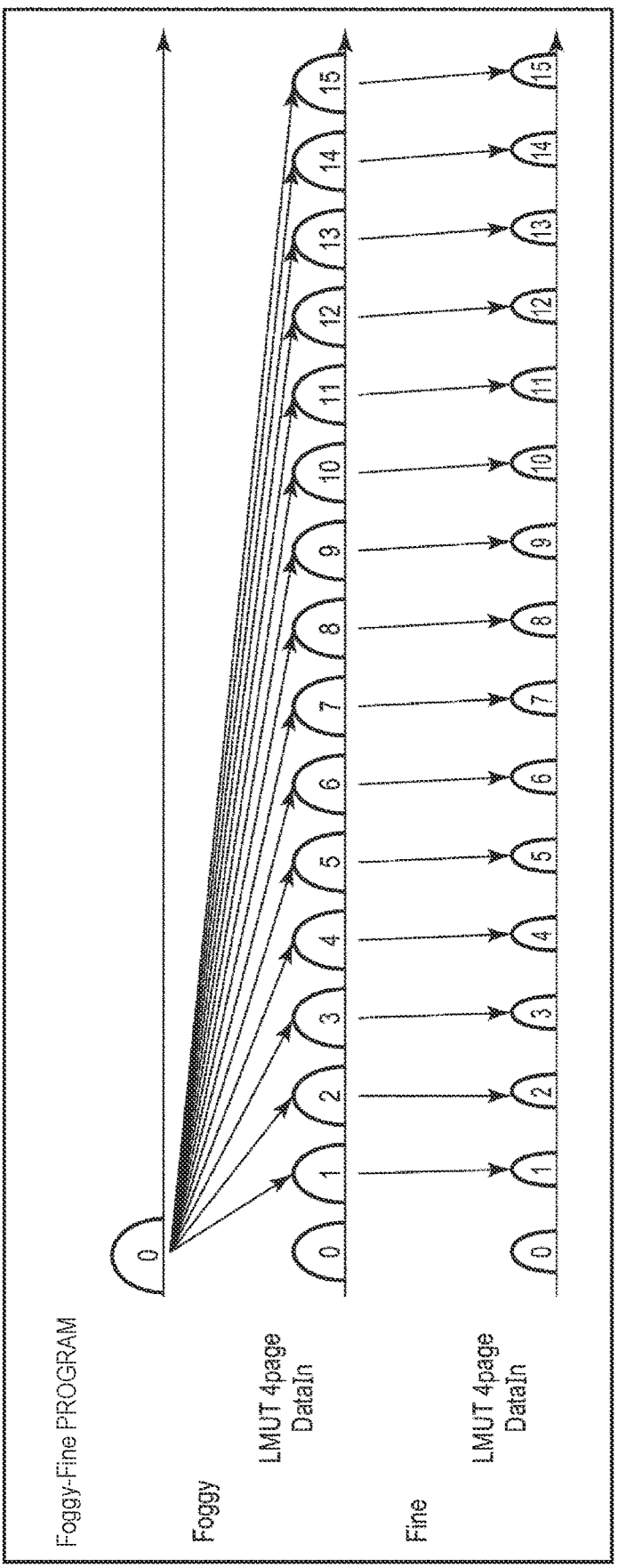
FIG. 2 is a conceptual diagram showing an overview of a Foggy-Fine program.
Figure 3:
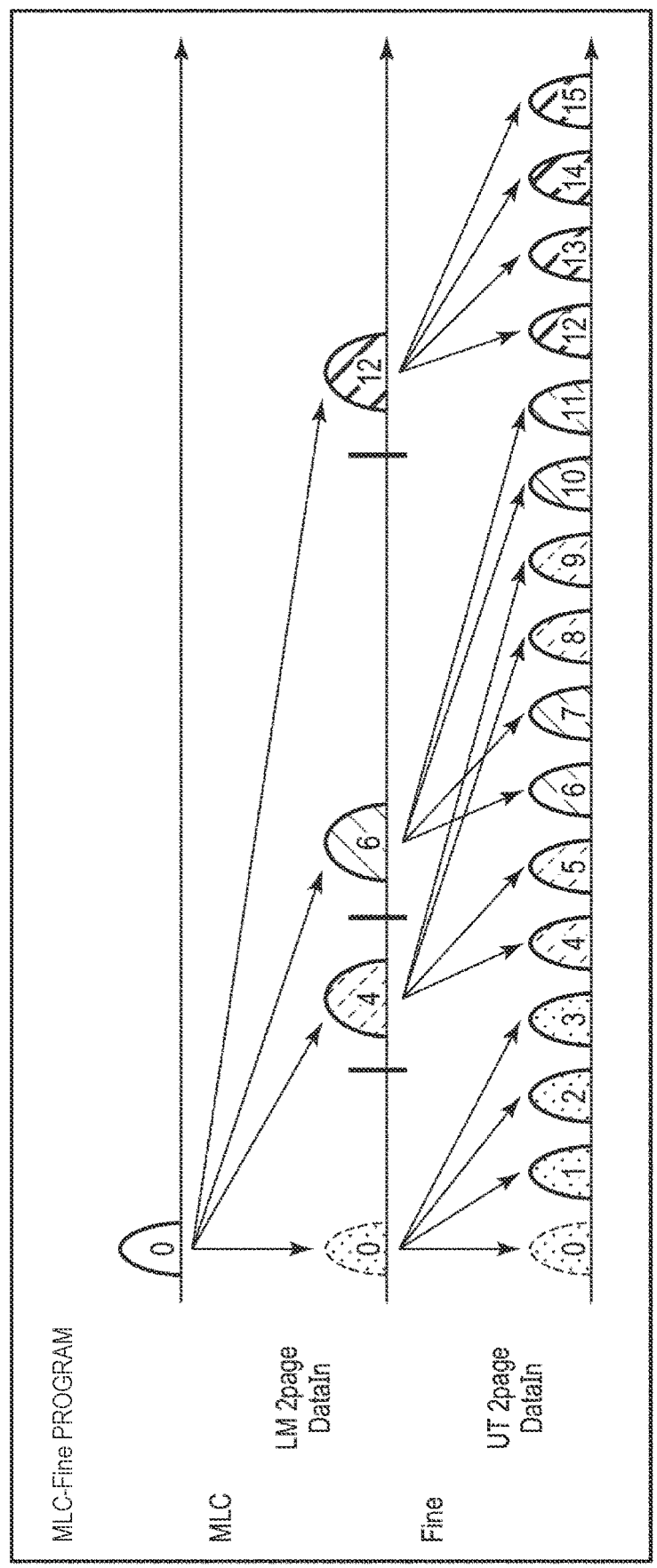
FIG. 3 is a conceptual diagram showing an overview of an MLC-Fine program.

Referring to FIGS. 2 and 3, an example of a method for performing writing on each memory cell in two steps, which may be applied in the memory system 1, will be described.

FIG. 2 is a conceptual diagram showing an overview of a Foggy-Fine program. FIG. 2 shows a two-step (Foggy, Fine) program procedure of QLC for writing 4 bits to one memory cell.

In FIG. 2, 16 mountain shapes from 0 to 15 represent 16 distributions in one-to-one correspondence with 16 values from "0000" to "1111" that may be taken by multi-valued data composed of 4 bits. A horizontal axis indicated by an arrow indicates a threshold voltage. The NAND memory 12 stores data based on an amount of charges stored in each memory cell. Each memory cell has a threshold voltage corresponding to the amount of charges. That is, the NAND memory 12 stores one of 16 values from "0000" to "1111" by adjusting the amount of charges injected into each memory cell. Each bit of the multi-valued data composed of 4 bits is called a lower page (L), middle page (M), upper page (U), and top page (T) from a lower bit.

In the Foggy-Fine program, charges are injected into memory cells twice, Foggy and Fine, so that the influence of writing (Foggy program) to adjacent memory cells is absorbed during the writing state by the Foggy program. After writing by the Fine program, writing by the Fine program to adjacent memory cells is affected, but the influence is limited compared to a case where the charges are injected into each memory cell at once. In the Foggy-Fine program, data for all four pages of LMUT are written to memory cells in both the first-step Foggy program and the second-step Fine program. That is, the Foggy-Fine program is a method in which the charges are injected twice with any one of 16 distributions from 0 to 15 as a target.

FIG. 3 is a diagram showing an overview of an MLC-Fine program. Similarly to the example of the Foggy-Fine program shown in FIG. 2, FIG. 3 shows a two-step (MLC, Fine) program procedure of QLC.

In the MLC-Fine program, first, the lower 2 bits (LM) of the 4 bits are written by the first-step MLC program. FIG. 3 assumes 3-2-5-5 data coding in which "1111", "1011", "0011", "0111", "0101", "1101", "1100", "1000", "1001", "0001", "0000", "0100", "0110", "1110", "1010", and "0011" are associated with 16 distributions from 0 to 15. In the 3-2-5-5 data coding, there are three boundaries between 0 and 1 on the lower page, two boundaries on the middle page, five boundaries on the upper page, and five boundaries on the top page. 16 data groups associated with each distribution in the 3-2-5-5 data coding are Gray codes in which only 1 bit of data changes between any two adjacent distributions.

As described above, in the MLC-Fine program, first, the lower 2 bits (LM) are written in the first-step MLC program. Specifically, charges are injected with any of "11" (distribution 0), "01" (distribution 4), "00" (distribution 6), or "10" (distribution 12) as a target.

After writing the lower 2 bits (LM) by the MLC program, the upper 2 bits (UT) are written in the second-step Fine program. Specifically, charges are injected so as to slide the threshold voltage set by the first-step MLC program. For example, when writing "1001" to a memory cell, the lower bit "01" is written to the first-step MLC program. This is charge injection with the distribution 4, which has the lowest threshold voltage among the distributions 4, 5, 8, and 9 in which the lower bit "01" is common, as a target. The lower 2 bits of the distributions 0, 1, 2, and 3 are common at "11", the lower 2 bits of the distributions 6, 7, 10, and 11 are common at "00", and the lower 2 bits of the distributions 12, 13, 14, and 15 are common at "10". In the second-step Fine program, the threshold voltage is moved from the distribution 4 to the distribution 8 that is associated with "1001".

Even in the MLC-Fine program, writing by the Fine program to adjacent memory cells is affected after writing by the Fine program, but the influence is limited compared to a case where the charges are injected into each memory cell at once. Furthermore, the MLC-Fine program has an advantage in that when the writing of the lower 2 bits (LM) by the first-step MLC program is completed, the lower 2 bits (LM) can be read without waiting for the completion of the writing of the upper 2 bits (UT) by the second-step Fine program.

Figures 4A, 4B:
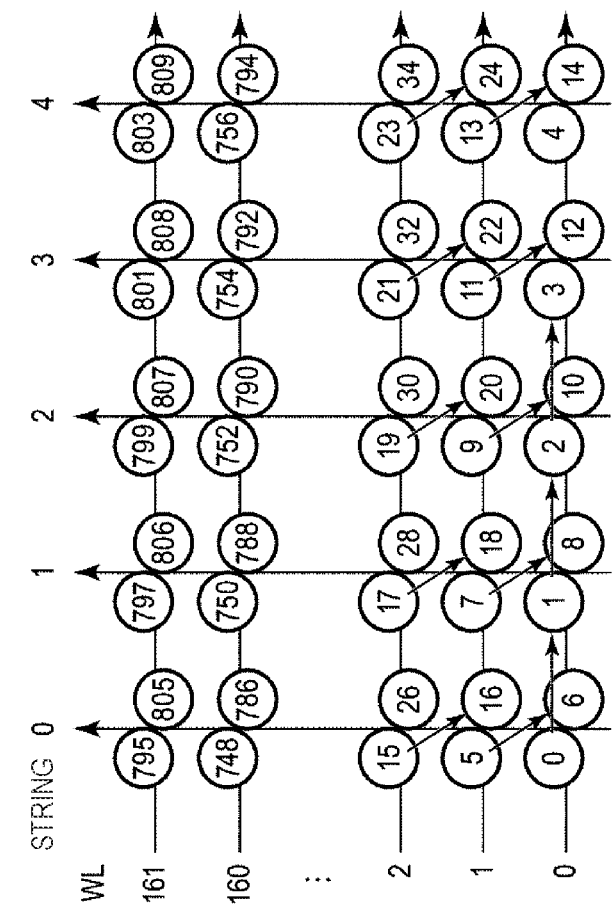
FIGS. 4A and 4B are diagrams showing an example of an execution order of steps in a two-step programming method.

Next, with reference to FIGS. 4A and 4B, an example of an execution order of each step in the method for performing writing on each memory cell in two steps as described above, will be described. FIGS. 4A and 4B assume a three-dimensional memory cell array in which memory cells are arranged in a three-dimensional manner. It is assumed herein that 162 plate-like word lines (WL) from 0 to 161 are vertically stacked, and five strings from 0 to 4 sharing the word lines are vertically disposed so as to pass through the 162 plate-like word lines. Each intersection of the word lines and the strings in FIG. 4A represents a memory cell. In addition, in two circled numbers disposed at each intersection, a left side thereof represents an order in which the first-step program is executed, and a right side thereof represents an order in which the second-step program is executed. It is assumed that the order of writing to the memory cells is: (1) ascending order of word line numbers, and (2) ascending order of string numbers.

For example, focusing on the memory cell of word line 0 and string 0, after the second-step program, the influence of the adjacent memory cell of word line 0 and string 1 and memory cell of word line 1 and string 0 (mutual interference between cells) is minimized when the second-step program is only performed in the two adjacent memory cells. In other words, the first-step program may be completed in the two adjacent memory cells before the second-step program.

As described above, in writing to the memory cell of the memory cell array, first, the first-step program is performed on memory cells of word line 0 and strings 0 to 4 (orders from 0 to 4). When the first-step program for the memory cells of word line 0 is completed, the first-step program is performed on a memory cell of word line 1 and string 0 (order 5). Then, at this point, the memory cell of word line 0 and string 0 is in a state where the adjacent memory cells have completed the first-step program. Therefore, next, the second-step program is performed on a memory cell of word line 0 and string 0 (order 6).

Next, the first-step program (order 7) is performed on a memory cell of word line 1 and string 1. Then, at this point, the memory cell of word line 0 and string 1 is now in a state where the adjacent memory cells have completed the first-step program. Next, the second-step program is performed on a memory cell of word line 0 and string 1 (order 8). Hereinafter, the first-step program (orders 9, 11, and 13) for memory cells of strings 2 to 4 of word line 1, and the second-step program (orders 10, 12, and 14) for memory cells of strings 2 to 4 of word line 0 are alternately performed.

Furthermore, similarly, the first-step program (orders 15, 17, 19, 21, and 23) for memory cells of strings 0 to 4 of word line 2, and the second-step program (orders 16, 18, 20, 22, and 24) for memory cells of strings 0 to 4 of word line 1 are alternately performed. Thus, in the three-dimensional memory cell array with five strings, writing to each memory cell is performed in two steps in the order shown in FIG. 4B.

Meanwhile, QLC is faster in reliability deterioration due to data retention deterioration (e.g., increase in BER over time) compared to SLC or TLC. As for the increase in BER, it is found that when performing writing to the memory cell in two steps, the longer the interval between the first-step program and the second-step program, the less the increase in BER. According to this perspective, the two-step program queuing control unit 111 controls an execution timing of the second-step program such that the interval from the first-step program is equal to or greater than the threshold.

FIG. 5 is a flowchart showing a procedure of writing (program) to the NAND memory 12 by the memory system 1 according to the first embodiment, which is implemented through the timing control of the second-step program by the two-step program queuing control unit 111.

First, the memory system 1 executes the first-step program for each string of the initial word line (S101). After executing the first-step program for each string of the initial word line, the memory system 1 adjusts a time (S102), the first-step program is executed for each string of the next word line, and the second-step program is executed for each string of the previous word line (S103). The previous word line at this time is a word line on which the one-step program has been executed for each string in S101.

After the first-step program has been executed for each string of the next word line, the memory system 1 adjusts the time again (S104). After adjusting the time, the memory system 1 determines whether the number of word lines on which the one-step program has been executed for each string is less than the number of word lines to be written (S105). When the number of word lines on which the one-step program has been executed for each string is less than the number of word lines to be written (S105: YES), the process by the memory system 1 returns to S103 for execution of the first-step program for each string of the next word line, and the memory system 1 executes the second-step program for each string of the previous word line. The previous word line at this time is a word line on which the first-step program has been executed for each string in previous S103.

When the memory system 1 determines that the number of word lines on which the first-step program has been executed for each string is less than the number of word lines to be written, the process repeats S103 and S104. When the number of word lines on which the first-step program is executed for each string reaches the number of word lines to be written (S105: NO), the memory system 1 executes the second-step program for each string of the last word line (S106).

As described above, the memory system 1 of the first embodiment intervenes the time adjustment of the hatched S102 and S104 between the first-step program and the second-step program for each string, in the timing control of the second-step program by the two-step program queuing control unit 111.

Figure 6:
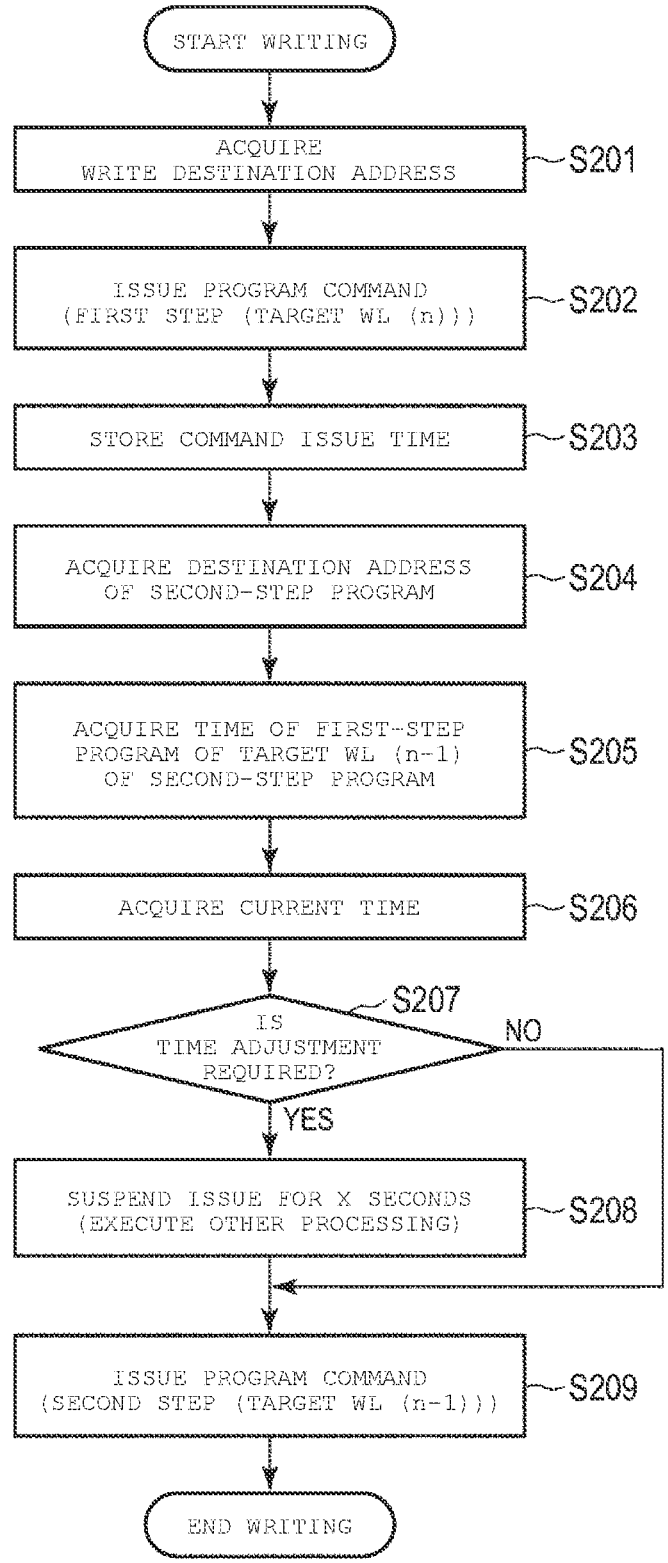
FIG. 6 is a flowchart showing a procedure of timing control of a second-step program executed in the memory system according to the first embodiment.

FIG. 6 is a flowchart showing a procedure of timing control of the second-step program executed by the two-step program queuing control unit 111.

The two-step program queuing control unit 111 acquires a write destination address (S201). The two-step program queuing control unit 111 issues a program command requesting the NAND memory 12 to perform the first-step program for a word line (n) based on the acquired address (S202). Specifically, the two-step program queuing control unit 111 inputs the program command into the queue 112. n is a natural number of 2 or more.

The two-step program queuing control unit 111 stores an issue time of the program command in S202 (S203). Specifically, the two-step program queuing control unit 111 has a program time storage area 131 provided in the DRAM 13, and stores the issue time of the program command in the program time storage area 131.

The two-step program queuing control unit 111 acquires a destination address of the second-step program (S204). The two-step program queuing control unit 111 acquires a time of the first-step program for a word line (n−1) of a target of the second-step program (issue time of a program command requesting the one-step program) from the program time storage area 131 in the DRAM 13 (S205). In addition, the two-step program queuing control unit 111 acquires a current time (S206).

The two-step program queuing control unit 111 determines whether time adjustment is required based on two times acquired in S205 and S206 (S207). The time adjustment is required when an elapsed time from the time acquired in S205 to the time acquired in S206 is less than the threshold. When it is determined that the time adjustment is required (S207: YES), the two-step program queuing control unit 111 suspends the issue of a program command requesting the NAND memory 12 to execute the second-step program for a word line (n−1) (S208). Specifically, the two-step program queuing control unit 111 has a command storage area 132 provided in the DRAM 13, and saves a program command, which is scheduled to be input into the queue 112 in the command storage area 132 in the order described with reference to FIGS. 4A and 4B. At this time, for example, the two-step program queuing control unit 111 may input a program command, which is scheduled after the next scheduled program command, into the queue 112 (execution of other processing).

The two-step program queuing control unit 111 issues the saved program command, that is, a program command requesting the NAND memory 12 to perform the two-step program for the word line (n−1), when X seconds have elapsed after the program command is saved (S209). In addition, when it is determined that the time adjustment is not required in S207 (S207: NO), the two-step program queuing control unit 111 skips the process of S208, and rapidly issues a program command requesting the NAND memory 12 to perform a two-step program for the word line (n−1) (S209).

As described above, in the memory system 1 according to the first embodiment, the two-step program queuing control unit 111 operates to store the time of the first-step program, and checks whether the elapsed time after the time of the first-step program is equal to or more than the threshold before executing the second-step program. When the elapsed time after the time of the first-step program is less than the threshold, the two-step program queuing control unit 111 suspends the second-step program for a certain period of time. As a result, in the memory system 1 according to the first embodiment, a timing of the second-step program is controlled from the first-step program to be equal to or more than the threshold. The interval between the first-step program and the second-step program is secured to be equal to or more than the threshold, so that the memory system 1 according to the first embodiment can prevent reliability deterioration due to data retention deterioration. The reliability deterioration is prevented due to the data retention deterioration, and thus a burden of background processing for reliability countermeasures is reduced in the memory system 1 according to the first embodiment.

Figure 7A:
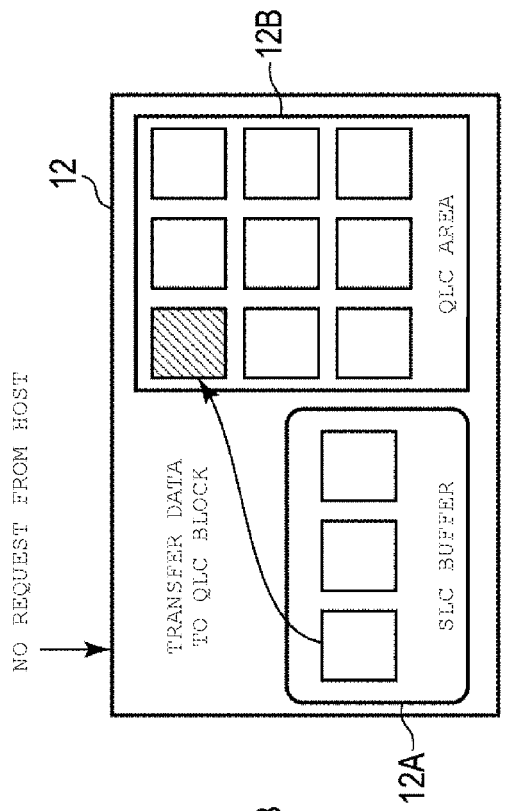
FIGS. 7A and 7B are diagrams showing a first implementation example of the timing control of the second-step program in the memory system according to the first embodiment.
Figure 7B:
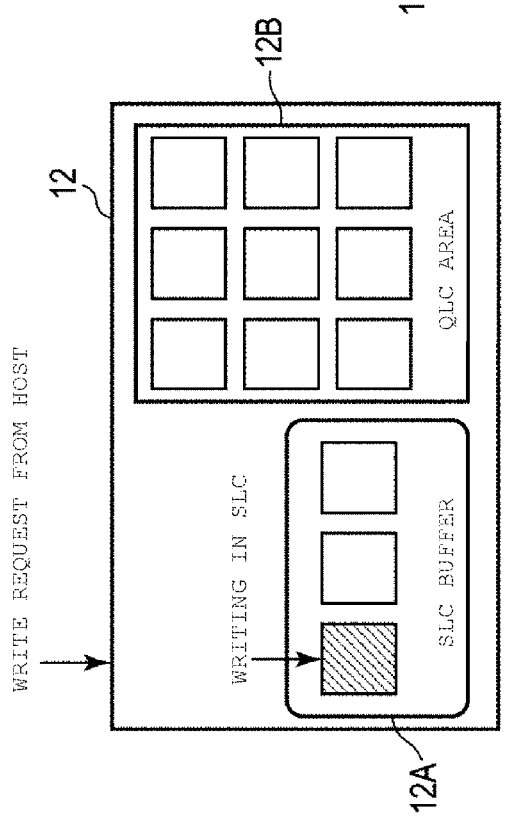

FIGS. 7A and 7B are diagrams showing a first implementation example of the timing control of the second-step program by the two-step program queuing control unit 111 in the memory system 1 according to the first embodiment.

It is assumed that the NAND memory 12 is divided into an SLC buffer 12A in which 1 bit of writing is performed on one memory cell and a QLC area 12B in which 4-bit writing is performed on one memory cell. The writing in QLC takes a time longer than that of the writing in SLC. According to this perspective, when receiving a write request from the host 2, the memory system 1 writes write data from the host 2 to the SLC buffer 12A as shown in FIG. 7A. After completing the writing to the SLC buffer 12A, the memory system 1 transmits a write completion response to the host 2. Thereafter, when there is no write request or read request from the host 2, the memory system 1 transfers the data written in the SLC buffer 12A to the QLC area 12B, as shown in FIG. 7B.

When transferring the data from the SLC buffer 12A to the QLC area 12B, the memory system 1 executes the timing control of the second-step program.

When there is no free SLC buffer 12A, the memory system 1 has no choice but to write the write data of the host 2 directly to the QLC area 12B. In this case, the memory system 1 prioritizes responsiveness over prevention of reliability deterioration, and rapidly executes the second-step program without the timing control of the second-step program.

Figure 8A:
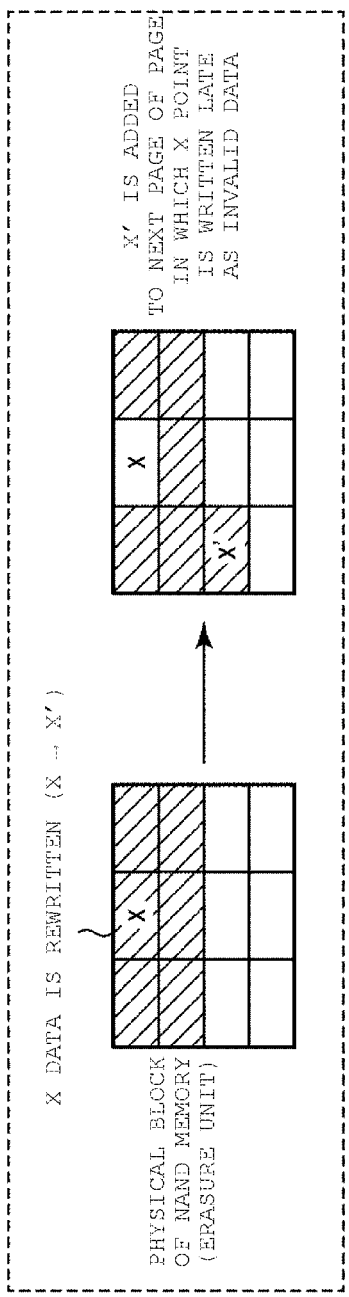
FIGS. 8A and 8B are diagrams showing a second implementation example of the timing control of the second-step program in the memory system according to the first embodiment.
Figure 8B:
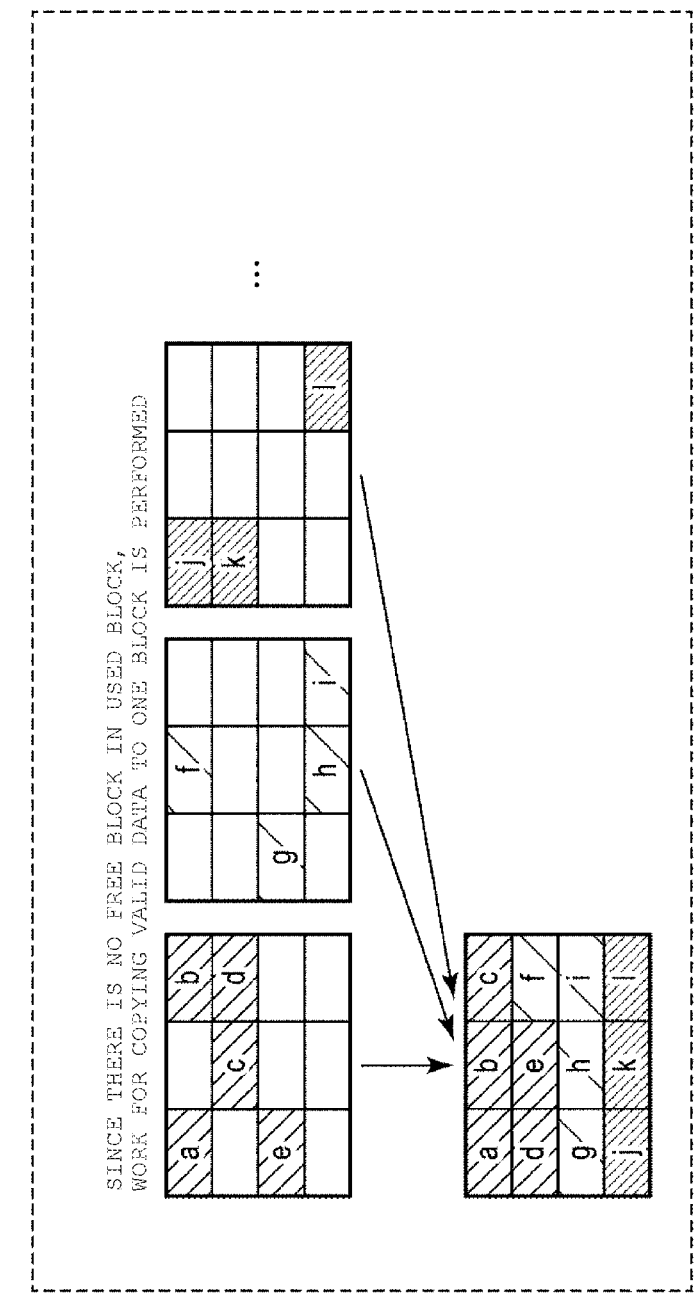

FIGS. 8A and 8B are diagrams showing a second implementation example of the timing control of the second-step program by the two-step program queuing control unit 111 in the memory system 1 according to the first embodiment.

As described above, data in the NAND memory 12 is updated by invalidating the original data on a certain page and writing the new data to the other pages. FIG. 8A shows an example in which data stored on an X page of a certain memory block 123 is rewritten. The original data stored in the X page is invalidated, and the new data is written to an X' page next to the last page in the memory block 123 to which the data was written. For simplification, FIG. 8A shows an example in which the new data is written to a page of the memory block 123 including the page in which the original data is stored, that is, to a page of the same memory block 123, but the new data may be written to a page of a memory block 123 different from the memory block 123 including the page in which the original data is stored.

When such data updates occur frequently, a ratio of invalid data in some memory blocks 123 increases. Since the memory block 123 is finite and has no free blocks as the writing of data progresses, the memory system 1 internally performs processing for reusing a page in which invalid data is stored. This processing is called garbage collection, compaction, or the like. FIG. 8B shows an overview of garbage collection (compaction).

FIG. 8B shows a status where there are a memory block 123 in which valid data is stored in five pages of a, b, c, d, and e, a memory block 123 in which valid data is stored in four pages of f, g, h, and i, and a memory block 123 in which valid data is stored in three pages of j, k, and l. Pages in each memory block 123 that are not labeled with alphabets are pages in which invalid data is stored.

The garbage collection creates one or more free memory blocks 123 by moving the valid data in N memory blocks 123 to memory blocks 123 of less than N. FIG. 8B shows an example in which the valid data in three memory blocks 123 is copied to one memory block 123. In this case, two (=3−1) free memory blocks 123 (free blocks) are created.

When the data is copied in the garbage collection, the memory system 1 executes the timing control of the second-step program. The garbage collection is a process that is internally executed by the memory system 1 and does not require responsiveness, so that it is allowed to suspend the execution of the second-step program.

As described above, the memory system 1 according to the first embodiment can prevent reliability deterioration due to data retention deterioration by the timing control of the second-step program by the two-step program queuing control unit 111.

Second Embodiment

Next, a second embodiment will be described.

In the memory system 1 according to the first embodiment, for example, when the three-dimensional memory cell array having 162 word lines and five strings is provided, the two-step program queuing control unit 111 executes the timing control on the second-step program for each string of all 162 word lines such that the elapsed time after the first-step program is equal to or greater than the threshold.

Meanwhile, in the memory system 1 according to the second embodiment, assuming that a word line having a high BER is known in advance, the two-step program queuing control unit 111 performs the timing control of the second-step program for only the word line having the high BER.

Figure 9:
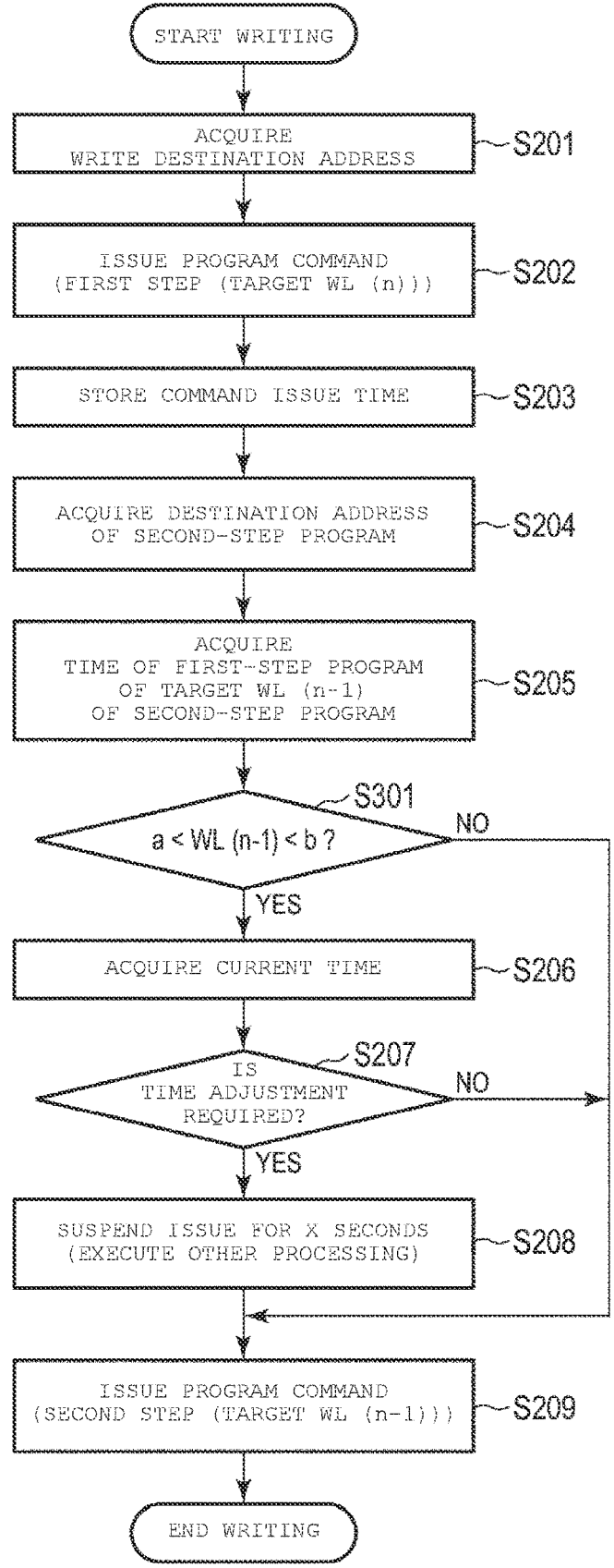
FIG. 9 is a flowchart showing a procedure of timing control of a second-step program executed in the memory system according to a second embodiment.

FIG. 9 is a flowchart showing a procedure of timing control of the second-step program by the two-step program queuing control unit 111 in the memory system 1 according to the second embodiment.

In the flowchart of FIG. 9, a step (S301) of determining whether the word line as a target of the second-step program is the word line having a high BER is inserted between S205 and S206 of the flowchart shown in FIG. 6 referred to the first embodiment. The two-step program queuing control unit 111 in the memory system 1 according to the second embodiment determines whether the word line as a target of the second-step program is the word line having a high BER (S301), and when the word line as a target of the second-step program is the word line having a high BER (S301: YES), the two-step program queuing control unit 111 executes the timing control of the second-step program as in the first embodiment (S206 to S208). On the other hand, when the word line as a target of the second-step program is not the word line having a high BER (S301: NO), the two-step program queuing control unit 111 skips the timing control of the second-step program (S206 to S208) and executes the second-step program.

For the sake of clarity, a case where word lines having a high BER are consecutively numbered, for example, 10 word lines from 61 to 70 word lines in 162 word lines from 0 to 161 word lines, is exemplified. In this case, in S301, "a" is "60" and "b" is "71". The determination formula of S301 may be created according to the number of the word line with a high BER, which is known in advance.

Further, the two-step program queuing control unit 111 may determine whether the timing control of the second-step program is executed by considering not only the word line but also the string. In this case, the determination formula of S301 may be created by combining the string numbers.

Furthermore, the two-step program queuing control unit 111 may control the time adjustment after the first-step program instead of whether the timing control of the second-step program is executed. For example, when it is determined that the word line as a target of the second-step program is the word line having a high BER, the two-step program queuing control unit 111 executes the timing control of the second-step program such that the second-step program is executed when the elapsed time after the first-step program is equal to or greater than the first threshold. On the other hand, when it is determined that the word line as a target of the second-step program is not the word line having a high BER, the two-step program queuing control unit 111 executes the timing control of the second-step program such that the second-step program is executed when the elapsed time after the first-step program is equal to or greater than a second threshold that is less than the first threshold.

As described above, in the memory system 1 according to the second embodiment, reliability deterioration due to data retention deterioration can be prevented, and deterioration in responsiveness can be minimized.

Third Embodiment

Next, a third embodiment will be described.

In the memory system 1 according to the third embodiment, when the two-step program queuing control unit 111 attempts to execute the second-step program for a certain string of a certain word line, if a predetermined time has not elapsed after the first-step program, the two-step program queuing control unit 111 executes the first-step program for the next string of the next word line in advance.

Figure 10:
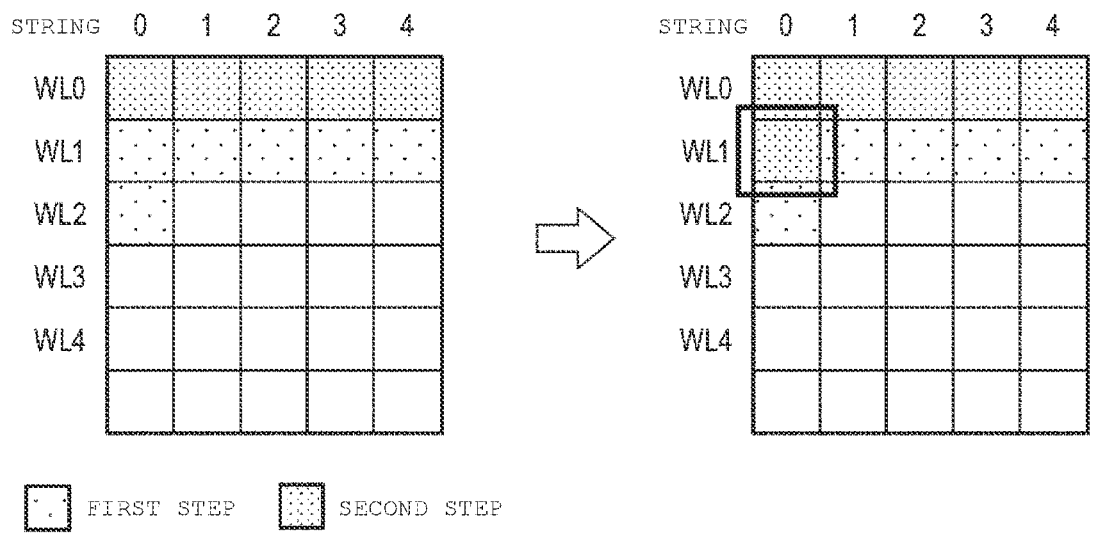
FIG. 10 is a diagram showing an example of an order in which memory cells in a memory block are programmed.

FIG. 10 is a diagram showing an example of an order in which memory cells in the memory block 123 are programmed.

On the left side of FIG. 10, a case is shown in which after the first-step program of word line 1 and the second-step program of word line 0 are alternately executed, the first-step program for string 0 of word line 2 is executed. In this case, as shown on the right side of FIG. 10, the second-step program for string 0 of word line 1 is scheduled to be executed next.

Figure 11:
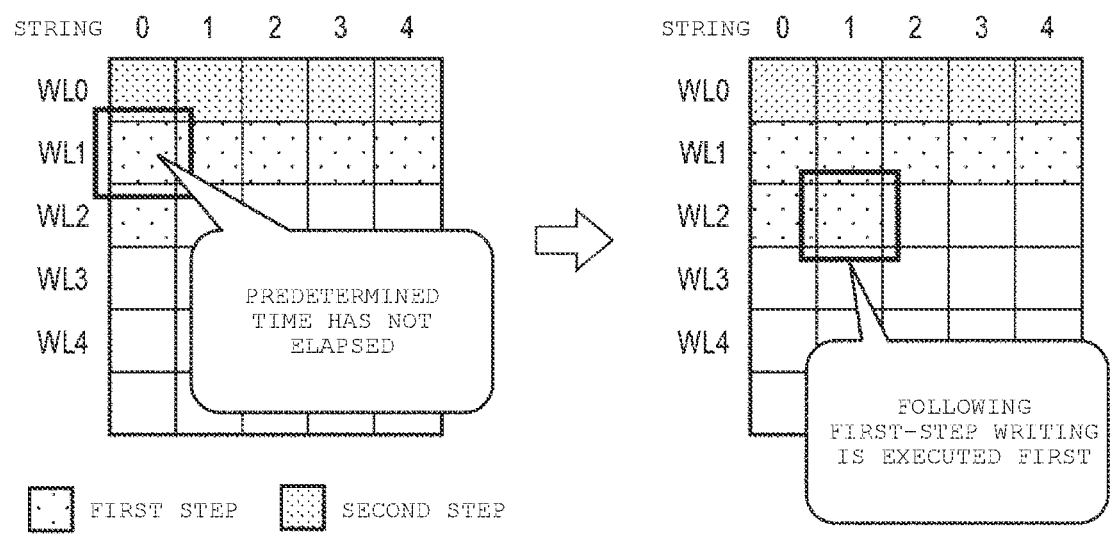
FIG. 11 is a diagram showing an example of program order in a memory system according to a third embodiment.

FIG. 11 shows an example of the program order in the memory system 1 according to the third embodiment when the elapsed time after the first-step program, which is executed for string 0 of word line 1, is less than a predetermined time in a state where the second-step program for string 0 of word line 1 is scheduled to be executed next.

The left side of FIG. 11 shows a case where the second-step program is attempted to be executed for string 0 of word line 1, but a predetermined time after the first-step program has not elapsed. In this case, in the memory system 1 according to the third embodiment, the two-step program queuing control unit 111 first executes the first-step program for string 1 of word line 2 as shown in the right side of FIG. 11.

The waiting time of the second-step program for string 0 of word line 1 is allocated to the first-step program for string 1 on word line 2, so that it is possible to reduce deterioration in responsiveness. In addition, when the second-step program for string 1 of word line 2 is executed, it is possible to increase the possibility that a predetermined time has previously elapsed after the first-step program.

Figure 12:
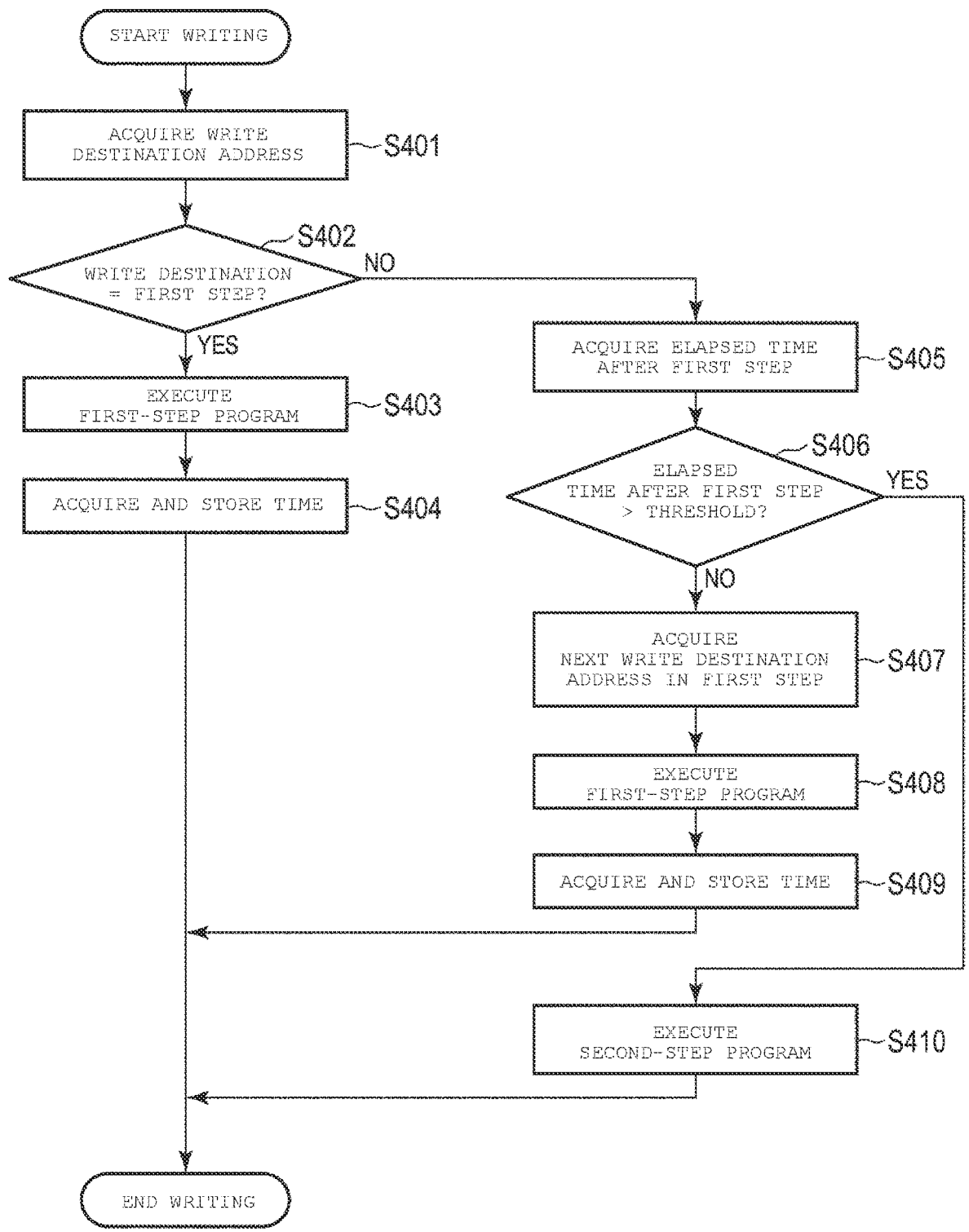
FIG. 12 is a flowchart showing a procedure of timing control of a second-step program executed in the memory system according to the third embodiment.

FIG. 12 is a flowchart showing a procedure of timing control of the second-step program by the two-step program queuing control unit 111 in the memory system 1 according to the third embodiment.

The two-step program queuing control unit 111 acquires a write destination address (S401). The two-step program queuing control unit 111 determines whether the program for the write destination is the first step based on the acquired address (S402). When the program for the write destination is the first step (S402: YES), the two-step program queuing control unit 111 executes the first-step program (S403). In this case, the two-step program queuing control unit 111 acquires and stores the time (S404).

On the other hand, when the program for the write destination is the second step instead of the first step (S402: NO), the two-step program queuing control unit 111 acquires the elapsed time after the first step (S405). Then, the two-step program queuing control unit 111 determines whether the elapsed time after the first step exceeds the threshold (S406).

When the elapsed time after the first step does not exceed the threshold (S406: NO), the two-step program queuing control unit 111 acquires the next write destination address in the first step (S407). The two-step program queuing control unit 111 executes the first-step program based on the acquired address (S408). Also in this case, the two-step program queuing control unit 111 stores and acquires the time (S409). The times acquired in S404 and S409 are stored such that the write destination address can be identified.

When the elapsed time after the first step exceeds the threshold (S406: YES), the two-step program queuing control unit 111 executes the second-step program for the write destination of the address acquired in S401 (S410).

As described above, in the memory system 1 according to the third embodiment, as in the memory system 1 according to the second embodiment, reliability deterioration due to data retention deterioration can be prevented, and deterioration in responsiveness can be reduced.

Fourth Embodiment

Next, a fourth embodiment will be described.

In the memory system 1 according to the third embodiment, the two-step program queuing control unit 111 changes the order of the second-step program and the first-step program in the same memory block 123 as necessary.

Meanwhile, in the memory system 1 according to the fourth embodiment, in a state where a predetermined time or longer is not secured between the first-step program and the second-step program, the two-step program queuing control unit 111 changes the program order such that writing proceeds over the plurality of memory blocks 123 in the same memory chip 121.

Figure 13:
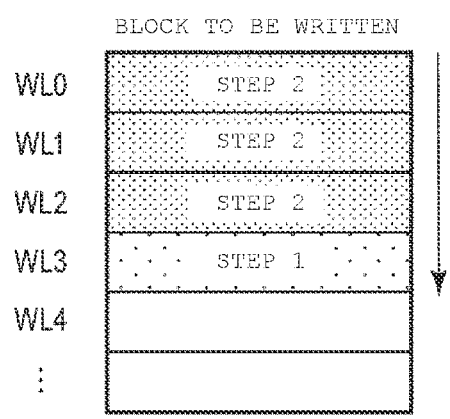
FIG. 13 is a diagram showing an example of a program order in which writing proceeds for each memory block.

FIG. 13 is a diagram showing an example of a program order in which writing proceeds for each memory block 123.

An example of the program order shown in FIG. 13 is that, for example, the first-step program for word line 2 and the second-step program for word line 1 are alternately executed in the memory block 123 to be written, and then the first-step program for word line 3 and the second-step program for word line 2 are alternately executed.

In the memory system 1 according to the third embodiment, for example, when the two-step program queuing control unit 111 attempts to execute the second-step program for word line 2 and string 0, if a predetermined time has not elapsed after the first-step program, the two-step program queuing control unit 111 executes the first-step program for word line 3 and string 1 in advance. Even after the first-step program for word line 3 and string 1, when a predetermined time after the first-step program for word line 2 and string 0 has not elapsed, the two-step program queuing control unit 111 further executes the first-step program for word line 3 and string 2 in advance.

Meanwhile, in the memory system 1 of the fourth embodiment, when it is detected that a predetermined time or longer is not secured between the first-step program and the second-step program, the two-step program queuing control unit 111 changes the program order such that writing proceeds over the plurality of memory blocks 123 in the same memory chip 121.

Figure 14:
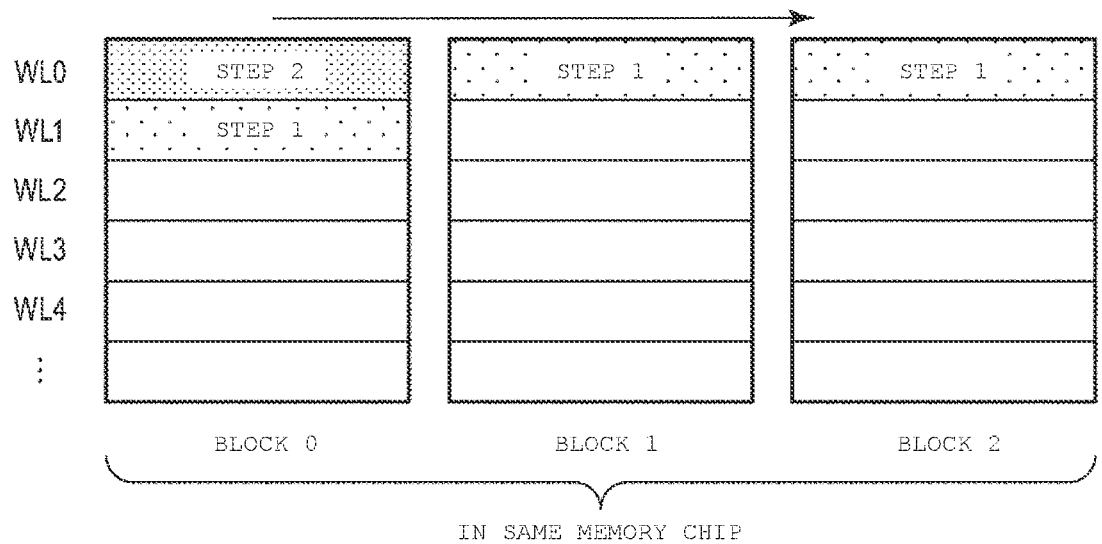
FIG. 14 is a diagram showing an example of a program order in which writing proceeds over a plurality of memory blocks in the same memory chip in a memory system according to a fourth embodiment.

FIG. 14 is a diagram showing an example of change in the program order by the two-step program queuing control unit 111 in the memory system 1 according to the fourth embodiment.

After executing the first-step program for word line 0 of block 0, the two-step program queuing control unit 111 executes the first-step program for word line 0 of block 1. Following executing the first-step program for word line 0 of block 1, the two-step program queuing control unit 111 executes the first-step program for word line 0 of block 2. By the two-step program queuing control unit 111, the first-step program for word line 0 proceeds with the blocks in the same memory chip 121 as a target.

In the same memory chip 121, when the first-step program for word line 0 proceeds over the memory block 123, the elapsed time after the first-step program for word line 0 of block 0 exceeds a predetermined time, and thus the two-step program queuing control unit 111 subsequently executes the second-step program for word line 0 for each memory block 123.

In other words, in the memory system 1 according to the fourth embodiment, the two-step program queuing control unit 111 changes the program order such that the second-step program follows the first-step program after the predetermined time has elapsed.

In the memory system 1 according to the fourth embodiment, reliability deterioration due to data retention deterioration can be prevented, and deterioration in responsiveness can be prevented.

Fifth Embodiment

Next, a fifth embodiment will be described.

A memory system 1 according to the fifth embodiment is an application example of changing the program order in the memory system 1 according to the fourth embodiment.

Figure 15A:
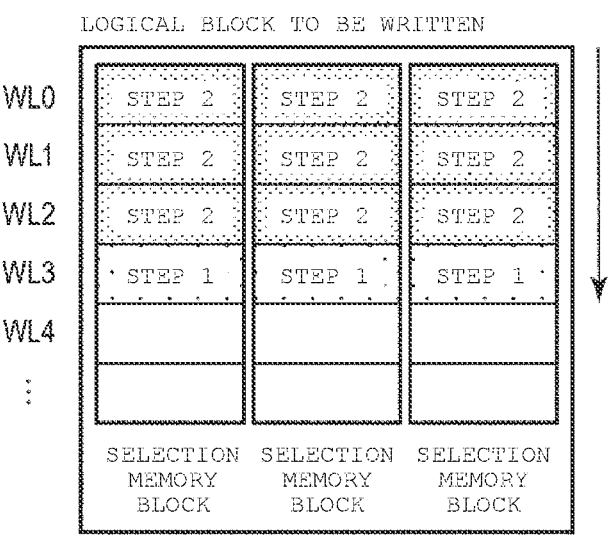
FIGS. 15A and 15B are diagrams showing an example of a program order in which writing proceeds for each logical block.
Figure 15B:
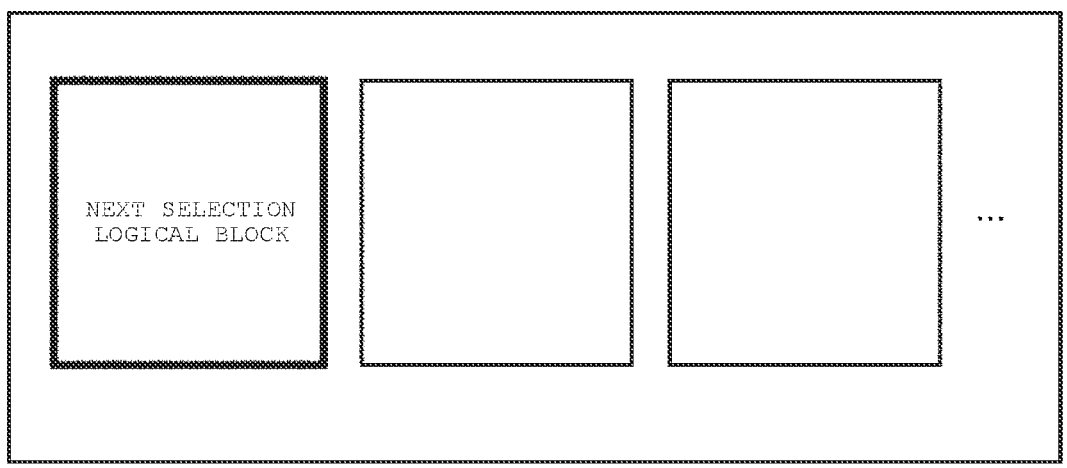

As an operation example of the memory system 1, one memory block 123 is selected from each of the plurality of dies 122 to create a logical block. FIGS. 15A and 15B are diagrams showing an example of a program order in which writing proceeds for each logical block when the logical block is created. FIG. 15A shows an example of creating logical blocks by three memory blocks 123 (selection memory block), which are selected one by one from each of three dies 122 of a die 122-0, a die 122-1, and a die 122-2.

An example of the program order shown in FIG. 15A is that, for example, the first-step program for word line 2 and the second-step program for word line 1 are alternately executed in the logical block to be written, and then the first-step program for word line 3 and the second-step program for word line 2 are alternately executed. When the program for a certain logical block is completed, one free logical block is selected from a free logical block pool shown in FIG. 15B, and the program proceeds in the same procedure.

Meanwhile, in the memory system 1 according to the fifth embodiment, the two-step program queuing control unit 111 changes the program order such that writing proceeds over a plurality of logical blocks.

Figure 16A:
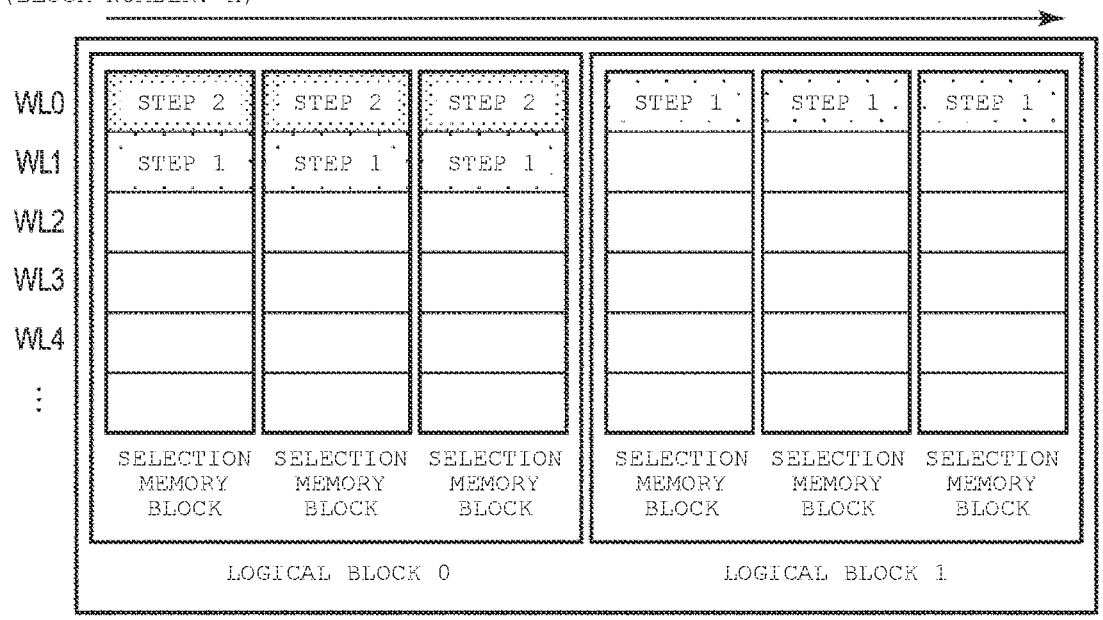
FIGS. 16A and 16B are diagrams showing an example of a program order in which writing proceeds over a plurality of logical blocks in a memory system according to a fifth embodiment.
Figure 16B:
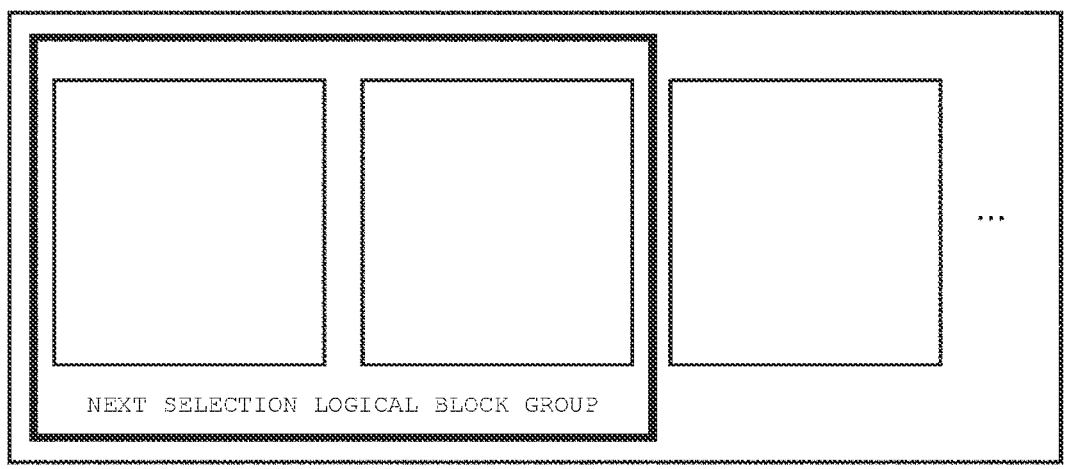

FIGS. 16A and 16B are diagrams showing an example of changing the program order by the two-step program queuing control unit 111 in the memory system 1 according to the fifth embodiment.

The two-step program queuing control unit 111 selects, for example, two logical blocks shown in FIG. 16A as logical blocks to be written. After executing the first-step program for word line 0 of logical block 0, the two-step program queuing control unit 111 executes the first-step program for word line 0 of logical block 1.

In the selected two logical blocks, when the first-step program for word line 0 proceeds over the logical blocks, the elapsed time after the first-step program for word line 0 of logical block 0 exceeds a predetermined time, and thus the two-step program queuing control unit 111 subsequently executes the second-step program for word line 0 for each logical block. When the program for the selected two logical blocks is completed, two free logical blocks are selected from a free logical block pool shown in FIG. 16B, and the program proceeds in the same procedure.

In other words, in the memory system 1 according to the fifth embodiment, as in the memory system 1 according to the fourth embodiment, the two-step program queuing control unit 111 changes the program order such that the second-step program follows the first-step program after the predetermined time has elapsed.

Therefore, in the memory system 1 according to the fifth embodiment, reliability deterioration due to data retention deterioration can be prevented, and deterioration in responsiveness can be prevented.

While certain embodiments have been described, these embodiments have been presented by way of example only, and are not intended to limit the scope of the disclosure. Indeed, the novel embodiments described herein may be embodied in a variety of other forms; furthermore, various omissions, substitutions, and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A memory system comprising:
a non-volatile memory including a plurality of memory cells; and
a controller configured to perform a multi-step write operation to write multi-bit data with respect to each of target memory cells through a first programming to set a first threshold voltage and then a second programming to set a second threshold voltage and manage an order of performing the first programming and the second programming with respect to each of the target memory cells,
wherein the controller is configured to, during the multi-step write operation:
determine a time period elapsed from a first time at which the first programming with respect to a first memory cell of the target memory cells has been performed;
in a case where the second programming is to be performed with respect to the first memory cell according to the order but the time period is less than a first threshold, change the order to perform the first programming with respect to another one of the target memory cells; and
in a case where the second programming is to be performed with respect to the first memory cell according to the order and the time period is greater than the first threshold, perform the second programming with respect to the first memory cell.

2. The memory system according to claim 1, wherein the plurality of memory cells includes memory cells connected to a first word line and memory cells connected to a second word line immediately adjacent to the first word line, and
the first memory cell is included in the memory cells connected to the first word line, and said another one of the target memory cells is included in the memory cells connected to the second word line.

3. The memory system according to claim 1, wherein the nonvolatile memory includes a memory chip that includes a die, the die having a first block including a plurality of memory cells and a second block including a plurality of memory cells, and
the first memory cell is included in the first block and said another one of the target memory cells is included in the second block.

4. The memory system according to claim 1, wherein the nonvolatile memory includes a memory chip that includes a first die including a plurality of blocks and a second die including a plurality of blocks, and
the first memory cell is included in one of the blocks of the first die and said another one of the target memory cells is included in one of the blocks of the second die.

5. The memory system according to claim 1, wherein the controller is configured to:
issue a program command to cause the non-volatile memory to execute the first programming with respect to the non-volatile memory;
store time information including a time when the program command has been issued; and
determine the first time based on the stored time information.

6. The memory system according to claim 1, wherein the first memory cell is connected to a first word line,
the plurality of memory cells includes a second memory cell connected to a second word line immediately adjacent to the first word line, and
the controller is configured to perform the first programming with respect to the second memory cell after the first programming with respect to the first memory cell, and then perform the second programming with respect to the first memory cell after the first programming with respect to the second memory cell.

7. The memory system according to claim 1, wherein the first threshold voltage set during the first programming corresponds to one of a first plurality of values,
the second threshold voltage set during the second programming corresponds to one of a second plurality of values, the second plurality of values being equal to the first plurality of values.

8. The memory system according to claim 1, wherein the first threshold voltage set during the first programming corresponds to one of a first plurality of values,
the second threshold voltage set during the second programming corresponds to one of a second plurality of values, the second plurality of values being greater than the first plurality of values.

9. The memory system according to claim 1, wherein the plurality of memory cells includes a first group of memory cells in a first region and a second group of memory cells in a second region, and
the controller is configured to perform a single-step write operation to write data with respect to a memory cell in the first region through a single programming, and perform the multi-step write operation when data stored in the first region is transferred to the second region.

10. The memory system according to claim 1, wherein the non-volatile memory includes a plurality of blocks each of which includes a plurality of memory cells, and
the controller is configured to perform the multi-step write operation when a garbage collection to selectively transfer valid data from two or more of the blocks to a single block is performed.

11. A memory system comprising:
a non-volatile memory including a plurality of memory cells; and
a controller configured to perform a multi-step write operation to write multi-bit data with respect to each of target memory cells through a first programming to set a first threshold voltage and then a second programming to set a second threshold voltage,
wherein the controller is configured to, during the multi-step write operation:
  determine a time period elapsed from a first time at which the first programming with respect to a first memory cell of the target memory cells has been performed, the first memory cell being connected to a first one of a plurality of word lines;
  determine whether the first one of the plurality of word lines satisfies a predetermined condition based on a bit error rate; and
  vary a second time at which the second programming with respect to the first memory cell is performed based on whether the time period is greater than a first threshold, upon determining that the first one of the plurality of word lines satisfies the predetermined condition.

12. The memory system according to claim 11, wherein the controller, during the multi-step write operation, does not vary the second time at which the second programming with respect to the first memory cell is performed based on the time period, upon determining that the first one of the word lines does not satisfy the predetermined condition.

13. The memory system according to claim 11, wherein the controller, during the multi-step write operation, varies the second time at which the second programming with respect to the first memory cell is performed based on whether the time period is greater than a second threshold, upon determining that the first one of the word lines does not satisfy the predetermined condition, the second threshold being less than the first threshold.

14. A method of controlling a non-volatile memory that includes a plurality of memory cells, comprising:
performing a multi-step write operation to write multi-bit data with respect to each of target memory cells through a first programming to set a first threshold voltage and then a second programming to set a second threshold voltage; and
managing an order of performing the first programming and the second programming with respect to each of the target memory cells,
wherein the method comprises, during the multi-step write operation:
  determining a time period elapsed from a first time at which the first programming with respect to a first memory cell of the target memory cells has been performed;
  in a case where the second programming is to be performed with respect to the first memory cell according to the order but the time period is less than a first threshold, change the order to perform the first programming with respect to another one of the target memory cells; and
  in a case where the second programming is to be performed with respect to the first memory cell according to the order and the time period is greater than the first threshold, perform the second programming with respect to the first memory cell.

15. The method according to claim 14, wherein the plurality of memory cells includes memory cells connected to a first word line and memory cells connected to a second word line immediately adjacent to the first word line, and
the first memory cell is included in the memory cells connected to the first word line, and said another one of the target memory cells is included in the memory cells connected to the second word line.

16. The method according to claim 14, wherein the nonvolatile memory includes a memory chip that includes a die, the die having a first block including a plurality of memory cells and a second block including a plurality of memory cells, and
the first memory cell is included in the first block and said another one of the target memory cells is included in the second block.

17. The method according to claim 14, wherein the nonvolatile memory includes a memory chip that includes a first die including a plurality of blocks and a second die including a plurality of blocks, and
the first memory cell is included in one of the blocks of the first die and said another one of the target memory cells is included in one of the blocks of the second die.

18. The method according to claim 14, further comprising:
issuing a program command to cause the non-volatile memory to execute the first programming with respect to the non-volatile memory;
storing time information including a time when the program command is issued; and
determining the first time based on the stored time information.

* * * * *